(12) United States Patent
Nagai et al.

(10) Patent No.: US 12,213,303 B2
(45) Date of Patent: Jan. 28, 2025

(54) SEMICONDUCTOR DEVICE AND METHOD OF FABRICATING THE SAME

(71) Applicant: Fujian Jinhua Integrated Circuit Co., Ltd., Quanzhou (CN)

(72) Inventors: Yukihiro Nagai, Quanzhou (CN); Lu-Yung Lin, Quanzhou (CN); Chia-Wei Wu, Quanzhou (CN); Tsun-Min Cheng, Quanzhou (CN); Yu Chun Lin, Quanzhou (CN); Zheng Guo Zhang, Quanzhou (CN); Sun-Hung Chen, Quanzhou (CN); Wu Xiang Li, Quanzhou (CN); Hsiao-Han Lin, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 288 days.

(21) Appl. No.: 17/725,567

(22) Filed: Apr. 21, 2022

(65) Prior Publication Data
US 2023/0284436 A1    Sep. 7, 2023

(30) Foreign Application Priority Data

Mar. 7, 2022    (CN) .......................... 202210217472.7
Mar. 7, 2022    (CN) .......................... 202220478999.0

(51) Int. Cl.
*H10B 12/00* (2023.01)

(52) U.S. Cl.
CPC .......... *H10B 12/34* (2023.02); *H10B 12/053* (2023.02); *H10B 12/09* (2023.02); *H10B 12/482* (2023.02); *H10B 12/485* (2023.02); *H10B 12/50* (2023.02)

(58) Field of Classification Search
CPC .... H10B 12/053; H10B 12/09; H10B 12/315; H10B 12/34; H10B 12/482; H10B 12/485; H10B 12/50
See application file for complete search history.

(56) References Cited

U.S. PATENT DOCUMENTS

| | | | |
|---|---|---|---|
| 6,552,401 B1 | 4/2003 | Dennison | |
| 10,340,278 B1 * | 7/2019 | Liu | ........................ H10B 12/09 |
| 10,679,997 B2 | 6/2020 | Jung et al. | |
| 2016/0093527 A1 | 3/2016 | Rouh et al. | |

FOREIGN PATENT DOCUMENTS

CN         111916399        2/2022

* cited by examiner

*Primary Examiner* — Meiya Li
(74) *Attorney, Agent, or Firm* — Winston Hsu

(57) ABSTRACT

The present disclosure provides a semiconductor device and a fabricating method thereof, and which includes a substrate, bit lines, bit line contacts, a gate structure, a first oxidized interface layer, and a second oxidized interface layer. The bit lines are disposed on the substrate, and the bit line contacts are disposed below the bit lines. The gate structure is disposed on the substrate, wherein each bit line and the gate structure respectively include a semiconductor layer, a conductive layer, and a covering layer stacked from bottom to top. The first oxidized interface layer is disposed between each bit line contact and the semiconductor layer of each bit line. The second oxidized interface layer is disposed within the semiconductor layer of the gate structure, wherein a topmost surface of the first oxidized interface layer is higher than a topmost surface of the second oxidized interface layer.

20 Claims, 9 Drawing Sheets

SEMICONDUCTOR DEVICE AND METHOD OF FABRICATING THE SAME

BACKGROUND OF THE INVENTION

1. Field of the Invention

The present invention relates to a semiconductor device and the method for fabricating the same, in particular to a semiconductor memory device and the method for fabricating the same.

2. Description of the Prior Art

With the trend of miniaturization of various electronic products, the design of semiconductor memory devices must meet the requirements of high integration and high density. For a dynamic random access memory (DRAM) having recessed gate structures, because the carrier channel of which is relatively long in the same semiconductor substrate compared with that of the DRAM without recessed gate structures, the leakage current from the capacitor structure in the DRAM can be reduced. Therefore, the DRAM having recessed gate structures has gradually replaced DRAM having planar gate structures under the current mainstream development trend.

Generally, the DRAM having recessed gate structure is constructed by a large number of memory cells which are arranged to form an array area, and each of the memory cells can be used to store information. Each memory cell may include a transistor element and a capacitor element connected in series, which is configured to receive voltage information from word lines (WL) and bit lines (BL). In order to fulfill the requirements of advanced products, the density of memory cells in the array area must be further increased, which increases the difficulty and complexity of related fabricating processes and designs. Therefore, the present technology needs further improvement to effectively improve the efficiency and reliability of related memory devices.

SUMMARY OF THE INVENTION

One of the objectives of the present disclosure provides a semiconductor device and a method of fabricating the same, in which bit lines and a gate structure with a composite semiconductor layer respectively are formed to improve the structural reliability of the bit lines and the bit line contacts. Then, the semiconductor device of the present disclosure enables to achieve better functions and device performances.

To achieve the purpose described above, one embodiment of the present disclosure provides a semiconductor device including a substrate, a plurality of bit lines, a plurality of bit line contacts, a gate structure, a first oxidized interface layer, and a second oxidized interface layer. The bit lines are disposed on the substrate. The bit line contacts are disposed in the substrate, below a portion of the bit lines. The gate structure is disposed on the substrate, wherein each of the bit lines and the gate structure respectively include a semiconductor layer, a conductive layer, and a covering layer stacked from bottom to top. The first oxidized interface layer is disposed between each of the bit line contacts and the semiconductor layer of each of the bit line. The second oxidized interface layer is disposed within the semiconductor layer of the gate structure, wherein a topmost surface of the first oxidized interface layer is higher than a topmost surface of the second oxidized interface layer.

To achieve the purpose described above, one embodiment of the present disclosure provides a method of forming a semiconductor device including the following steps. Firstly, a substrate is provided, and a plurality of bit lines is formed on the substrate. Then, a plurality of bit line contacts is formed in the substrate, under a portion of the bit lines. Next, a gate structure is formed on the substrate, wherein the bit lines and the gate structure respectively comprise a semiconductor layer, a conductive layer and a covering layer stacked from bottom to top. Also, a first oxidized interface layer is formed between each of the bit line contacts and the semiconductor layer of each of the bit lines, and a second oxidized interface layer is formed in the semiconductor layer of the gate structure, wherein a topmost surface of the second oxidized interface layer is higher than a topmost surface of the first oxidized interface layer.

To achieve the purpose described above, one embodiment of the present disclosure provides a semiconductor device including a substrate, a plurality of bit lines, a plurality of bit line contacts, a gate structure, and a oxidized interface layer. The bit lines are disposed on the substrate. The bit line contacts are disposed in the substrate, below a portion of the bit lines. The gate structure is disposed on the substrate, wherein each of the bit lines and the gate structure respectively include a semiconductor layer, a conductive layer, and a covering layer stacked from bottom to top. The oxidized interface layer is disposed between each of the bit line contacts and the semiconductor layer of each of the bit line.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are directed to provide a better understanding of the embodiments and are included as parts of the specification of the present invention. These drawings and descriptions are used to illustrate the principles of the embodiments. It should be noted that all drawings are schematic, and the relative dimensions and scales have been adjusted for the convenience of drawing. Identical or similar features in different embodiments are marked with identical symbols.

FIG. 1 to FIG. 5 are schematic diagrams illustrating a fabricating method of a semiconductor device according to a first embodiment in the present disclosure, wherein:

FIG. 1 shows a schematic top view of a semiconductor device after forming word lines;

FIG. 2 shows a schematic cross-sectional view taken along a cross-line A-A' and a cross-line B-B' in FIG. 1;

FIG. 3 shows a schematic cross-sectional view of a semiconductor device after forming bit line contact openings;

FIG. 4 shows a schematic cross-sectional view of a semiconductor device after forming bit line contacts; and FIG. 5 shows a schematic cross-sectional view of a semiconductor device after forming bit lines and gate stacks.

FIG. 6 to FIG. 10 are schematic diagrams illustrating a fabricating method of a semiconductor device according to a second embodiment in the present disclosure, wherein:

FIG. 6 shows a schematic cross-sectional view of a semiconductor device after performing an etching process;

FIG. 7 shows a schematic cross-sectional view of a semiconductor device after forming a second semiconductor layer;

FIG. 8 shows a schematic cross-sectional view of a semiconductor device after forming bit lines and gate stacks;

FIG. 9 shows a schematic top view of a semiconductor device after performing a patterning process; and FIG. 10 shows a schematic cross-sectional view taken along a cross-line A-A' and a cross-line B-B' in FIG. 9.

DETAILED DESCRIPTION

To provide a better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1:
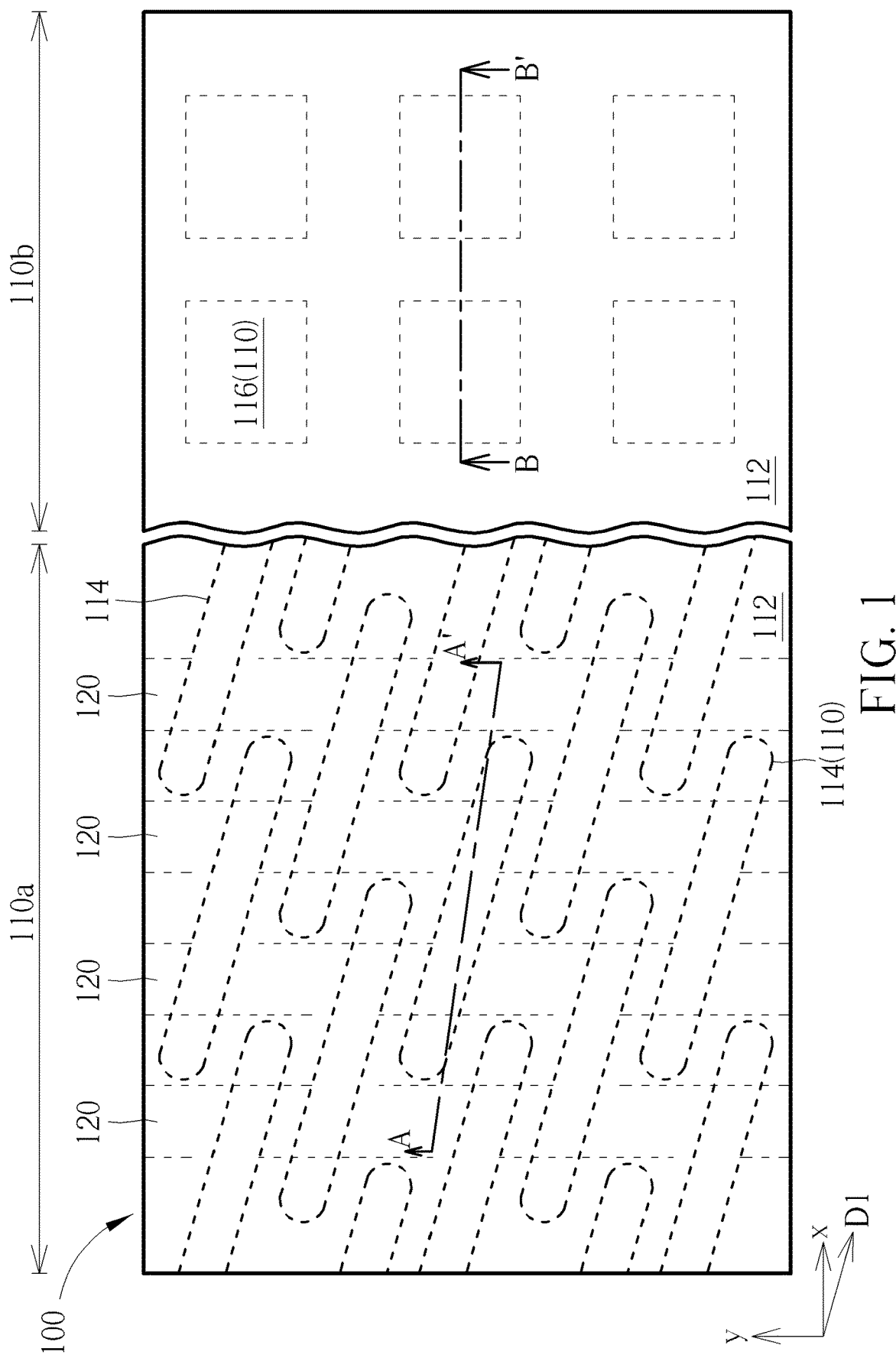
Figure 2:
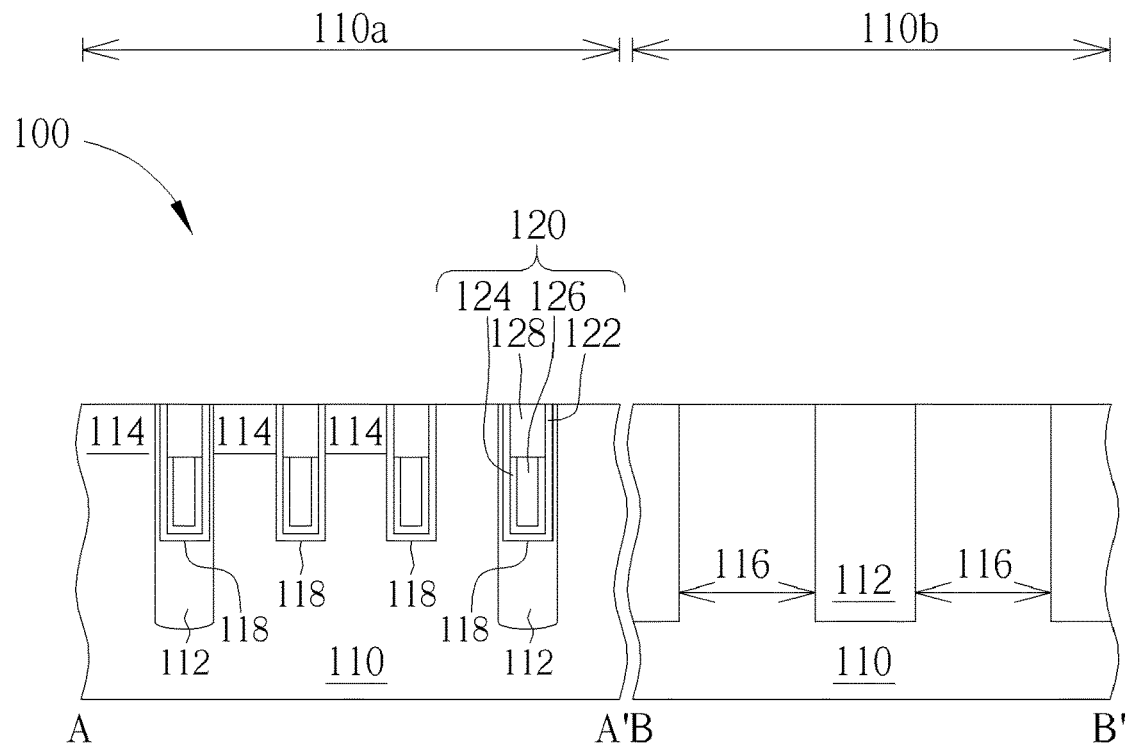

Please refer to FIG. 1 to FIG. 5, which illustrate schematic diagrams of a semiconductor device 100 according to the first embodiment in the present disclosure, with FIG. 1 illustrating a top view of the semiconductor device 100 during the fabricating processes, and with FIG. 2 to FIG. 5 respectively illustrating a cross-sectional view of the semiconductor device 100 during the fabricating processes. Firstly, as shown in FIG. 1 and FIG. 2, a substrate 110, for example a silicon substrate, a silicon containing substrate (such as SiC or SiGe), or a silicon-on-insulator (SOI) substrate, is provided, and at least two regions are defined on the substrate 110, for example including a memory cell region 110a being relative higher integrity and a periphery region 110b being relative lower integrity. Preferably, the periphery region 110b is disposed to surround the memory cell region 110a, but is not limited thereto. Also, at least one shallow trench isolation (STI) 112 is formed in the substrate 110, to define a plurality of active areas (AAs) 114, 116, with all of the active areas 114, 116 being surrounded by the shallow trench isolation 112, as shown in FIG. 1. In one embodiment, the formation of the shallow trench isolation 112 is accomplished by firstly performing an etching process to form a plurality of trenches (not shown in the drawings), followed by filling in an insulating material (such as silicon oxide or silicon oxynitride) in the trenches, but is not limited thereto.

In the present embodiment, the active areas 114 disposed within the memory cell region 110a for example include a relative smaller width and a relative smaller pitch, and each of the active areas 114 is parallel extended with each other along a same direction D1, wherein the direction D1 for example intersects and is not perpendicular to the y direction or the x direction. The active areas 116 disposed within the periphery region 110b for example include a relative greater width and a relative greater pitch, and each of the active areas 116 is parallel extended with each other along the x-direction, and is arranged in sequent, as shown in FIG. 1, but not limited thereto.

Then, a plurality of gate structures, such as buried gate structures 120 may be formed in the substrate 100, within the memory cell region 110a, the buried gate structures 120 are parallel extend with each other in the y-direction, to cross each of the active areas 114. In the present embodiment, the formation of the buried gate structures 120 includes but is not limited to the following steps. Firstly, a plurality of trenches 118 parallel extending along the y-direction is formed in the substrate 100. Then, a dielectric layer 122 covering entire surfaces of each trench 118, a gate dielectric layer 124 covering surfaces of a bottom portion of each trench 118, a gate electrode 126 filled in the bottom portion of each trench 118, and a covering layer 128 filled in a top portion of each trench 118 are sequentially formed in each trench 108. Then, the covering layer 128 has a top surface leveled with a top surface of the substrate 110, so that, the buried gate structures 120 formed in the substrate 110 may therefore function like buried word lines of the semiconductor device 100 for accepting or transmitting the voltage signals from memory cells (not shown in the drawings), as shown in FIG. 2.

Figure 3:
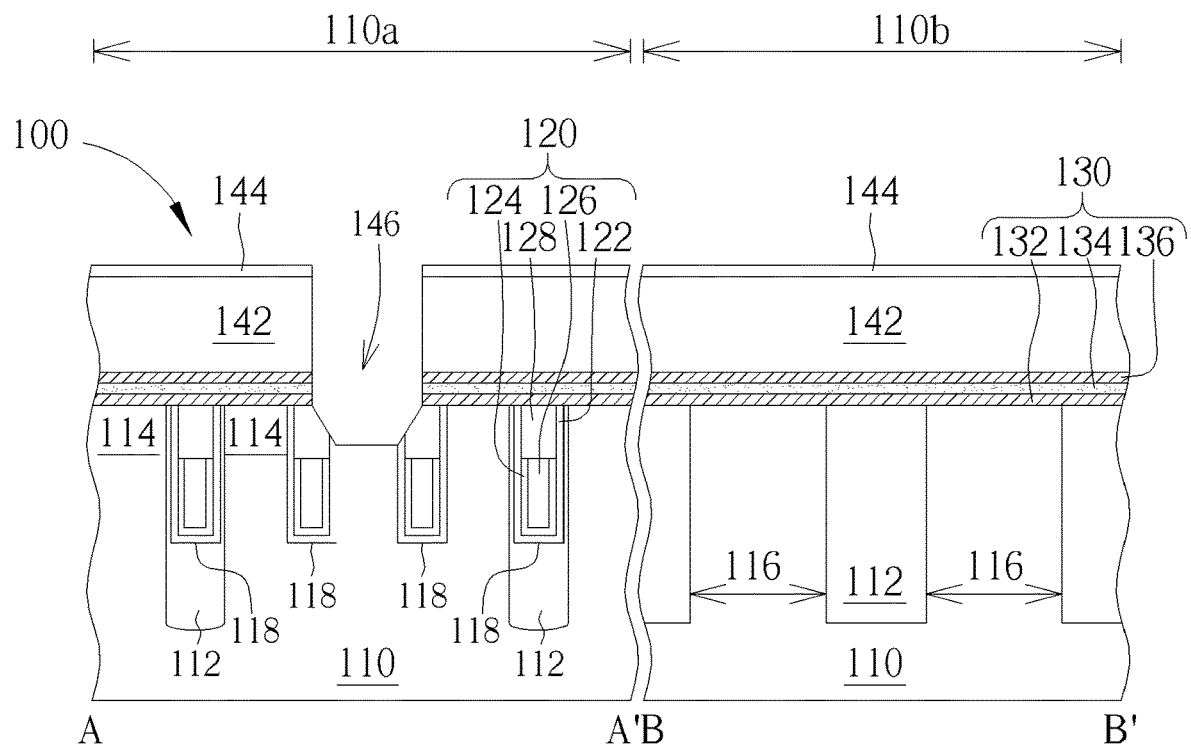

As shown in FIG. 3, an insulating layer 130, a first semiconductor layer 142 and a protection layer 144 are formed sequentially on the substrate 110 to cover the memory cell region 110a and the periphery region 110b of the substrate 110. The first semiconductor layer 142 for example includes a semiconductor material like doped silicon, doped phosphorus, or silicon phosphide (SiP), and preferably includes doped silicon, and the insulating layer 130 for example includes a composite structure for example including an oxide layer 132—a nitride layer 134—an oxide layer 136 (ONO) structure, but is not limited thereto. Then, a plurality of contact openings 146 is formed in the memory cell region 110a, with each of the contact openings 146 penetrating the protection layer 144, the first semiconductor layer 142, and the insulating layer 130 to expose a portion of the active areas 114. The formation of the contact openings 146 includes but is not limited to the following steps. Firstly, a mask structure (not shown in the drawings) is formed on the substrate 110, with the mask structure for example including a sacrificial layer (not shown in the drawings, for example including an organic dielectric layer), a silicon-containing hard mask (SHB, not shown in the drawings), and a patterned photoresist layer (not shown in the drawings) stacked one over another on the protection layer 144. The patterned photoresist layer includes at least one pattern for defining the contact openings 146, and an etching process is performed through the patterned photoresist layer, to form the contact openings 146 in the insulating layer 130, the first semiconductor layer 142, and the protection layer 144, wherein each of the contact openings 146 is in alignment with each of the active areas 114. It is noted that, each of the contact openings 146 is formed between two adjacent ones of the word lines (namely, the buried gate structures 120), so that, a portion of the active areas 114 (namely, the substrate 110) may be exposed from the bottom of the contact openings 146, as shown in FIG. 3. After that, the mask structure is completely removed.

Figure 4:
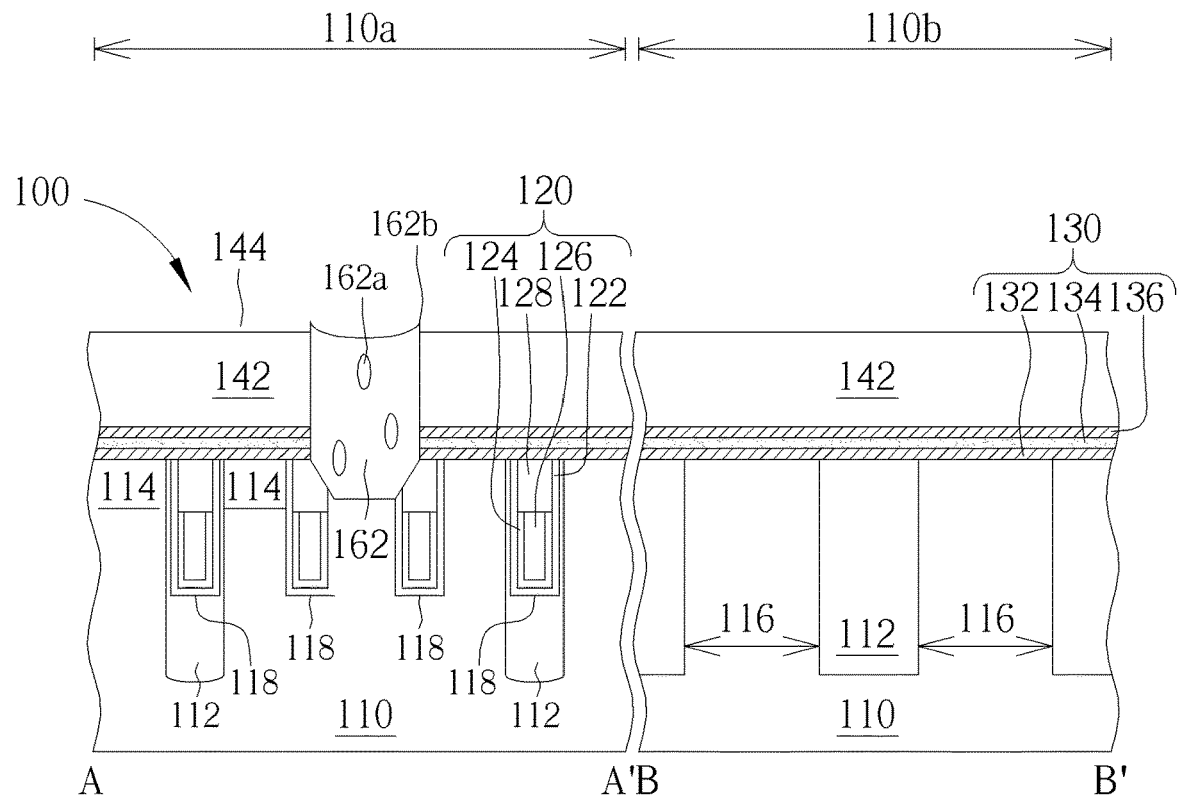

As shown in FIG. 4, a deposition process and an etching bask process are sequentially performed on the substrate 110, to form contacts 162 in the contact openings 146. Precisely speaking, a chemical vapor deposition (CVD) process is firstly performed, to form a conductive layer (not shown in the drawings) on the protection layer 144, filling up the contact openings 146, wherein the conductive layer for example includes doped silicon, doped phosphorus, or silicon phosphide, and preferably includes the same semiconductor material (for example the doped silicon) as the first semiconductor layer 142, but is not limited thereto. Then, a dry etching process is performed, to completely remove the conductive layer disposed on the protection layer 144 to expose the protection layer 144 underneath, and to partially remove the conductive layer disposed within the contact openings 146, and the protection layer 144 is completely remove, to form the contacts 162 and to expose the first semiconductor layer 142 under the protection layer 144. It is noteworthy that, the semiconductor material of the conductive layer has poor gap-filling capacity, such that, the external air may easily remain in the conductive layer filled in the contact openings 146, thereby forming voids. Also, the conductive layer filled in the contact openings 146 may easily present a relative lower, sunken top surface (not shown in the drawings). In this way, the relative lower, sunken top surface may easily lead to loading effect during performing the subsequent etching back process, and the etching performance is relative slower at a portion of the conductive layer which is disposed adjacent to the sidewalls of the contact openings 146, and the etching performance is relative higher at a portion of the conductive layer which is disposed at the center of each of the contact openings 146. Accordingly, the contacts 162 may include a plurality of the voids such as voids 162a as shown in FIG. 4, and two sides of each of the contacts 162 may form a relative higher protrusion 162b, as shown in FIG. 4.

Figure 5:
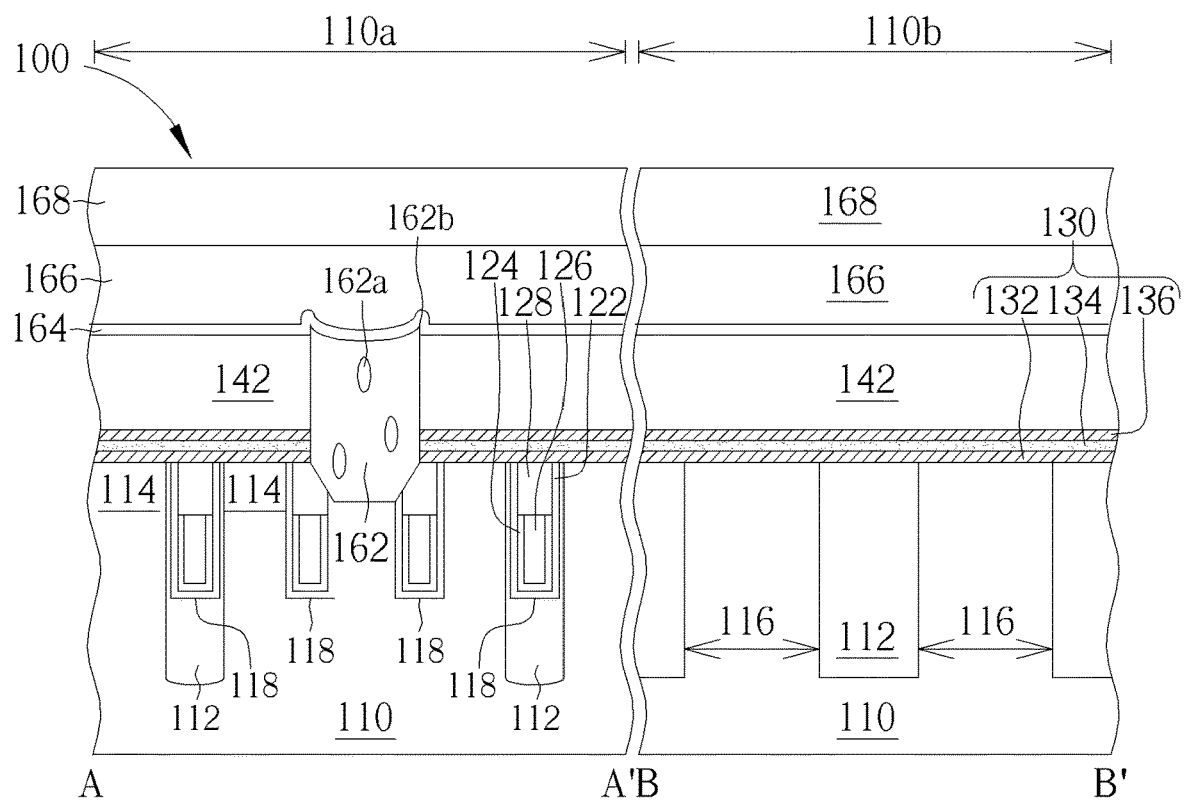

Following these, as shown in FIG. 5, a barrier layer 164, a conductive layer 166, and a covering layer 168 are sequentially formed on the first semiconductor layer 142, to entirely cover the memory cell region 110a and the periphery region 110b of the substrate 110. The barrier layer 164 formed within the memory cell region 110a directly contacts each of the contacts 162 and the first semiconductor layer 142, and the barrier layer 164 formed within the periphery region 110b directly contacts the first semiconductor layer 142. In one embodiment, the barrier layer 164 for example includes tantalum (Ta) and/or tantalum nitride (TaN), or titanium (Ti) and/or titanium nitride (TiN), and the conductive layer 166 for example includes a low-resistant metal like aluminum (Al), titanium, copper (Cu), or tungsten (W), and the covering layer 168 for example includes a dielectric material like silicon oxide, silicon nitride, or silicon oxynitride, but is not limited thereto. Then, a patterning process is performed, to pattern the first semiconductor layer 142, the barrier layer 164, the conductive layer 166, and the covering layer 168 stacked one over another, to simultaneously form a plurality of bit lines (not shown in the drawings) parallel extended along the x-direction in the memory cell region 110a, and a plurality of gate structures (not shown in the drawings) parallel extended along the y-direction in the periphery region 110b, with each of the bit line and each of the gate structures respectively include a patterned semiconductor layer (not shown in the drawings), a patterned barrier layer (not shown in the drawings), a patterned conductive layer (not shown in the drawings), and a patterned covering layer (not shown in the drawings) stacked from bottom to top. With these arrangements, each of the bit lines disposed on the substrate 110 may be electrically connected to source/drain regions (not shown in the drawings) of a transistor (not shown in the drawings) disposed in the substrate 110 through the contacts 162 disposed under the bit lines 160, and be isolated from the word lines (namely the buried gate structure 120) disposed within the substrate 110 through the isolating layer 130.

Through the above-mentioned processes, the semiconductor device 100 according to the first embodiment of the present disclosure is formed. Accordingly to the fabricating method of the present embodiment, a first semiconductor layer 142 entirely covering the substrate 110 is firstly formed, followed by defining the contact openings 146 through the first semiconductor layer 142, and forming the contacts 162 in the contact openings 146 respectively. After that, the barrier layer 164, the conductive layer 166, and the covering layer 168 stacked from bottom to top are sequentially formed on the first semiconductor layer 142, and the patterning process is then performed to pattern the first semiconductor layer 142, the barrier layer 164, the conductive layer 166, and the covering layer 168, to form the bit lines and the gate structures respectively within the memory cell region 110a and within the periphery region 110b. Thus, the fabricating method of the present embodiment enables to form the semiconductor device 100 with enhanced performances under the simplified process flow.

Furthermore, people in the art shall easily realize that the semiconductor device and the method of fabricating the same in the present disclosure are not limited to the aforementioned embodiment, and may include other examples. For example, the voids 162a disposed within the contacts 162 and/or the protrusions 162b disposed on the contacts 162 may be removed in further in other embodiments, for improving the structural reliability of the contacts 162. The following description will detail the different embodiments of the forming method of semiconductor device in the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 6:
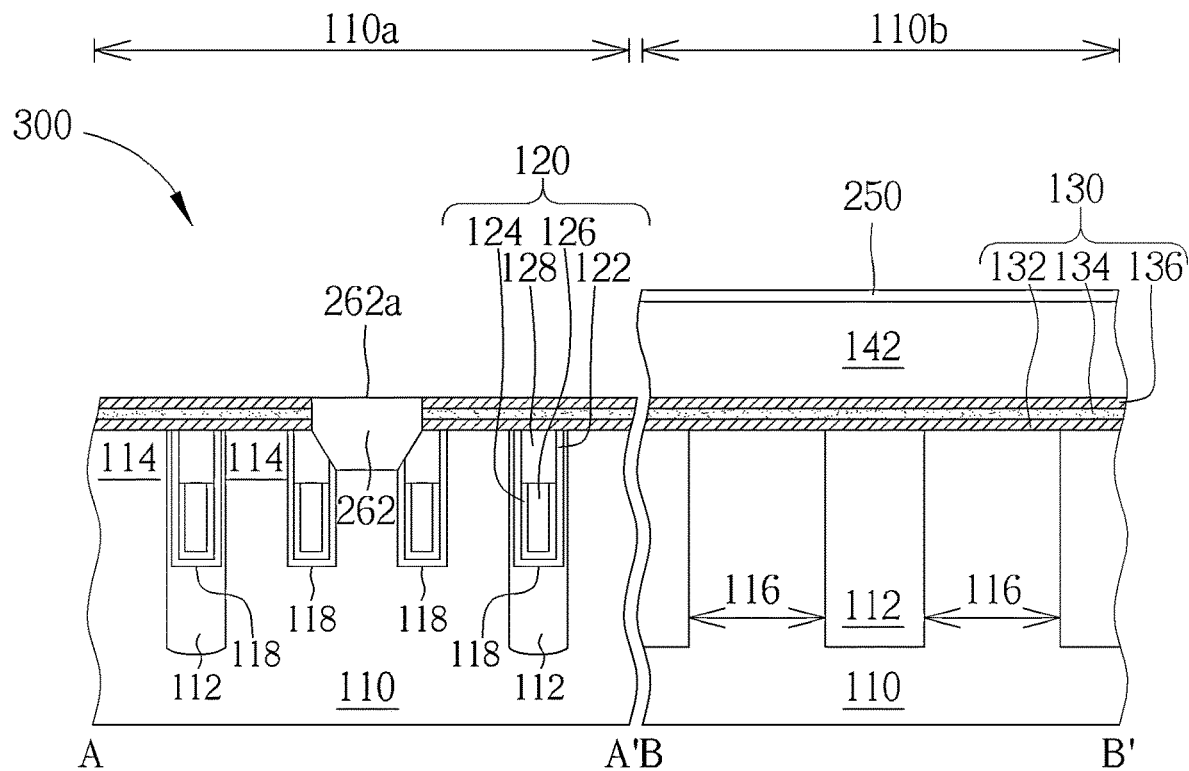
Figure 7:
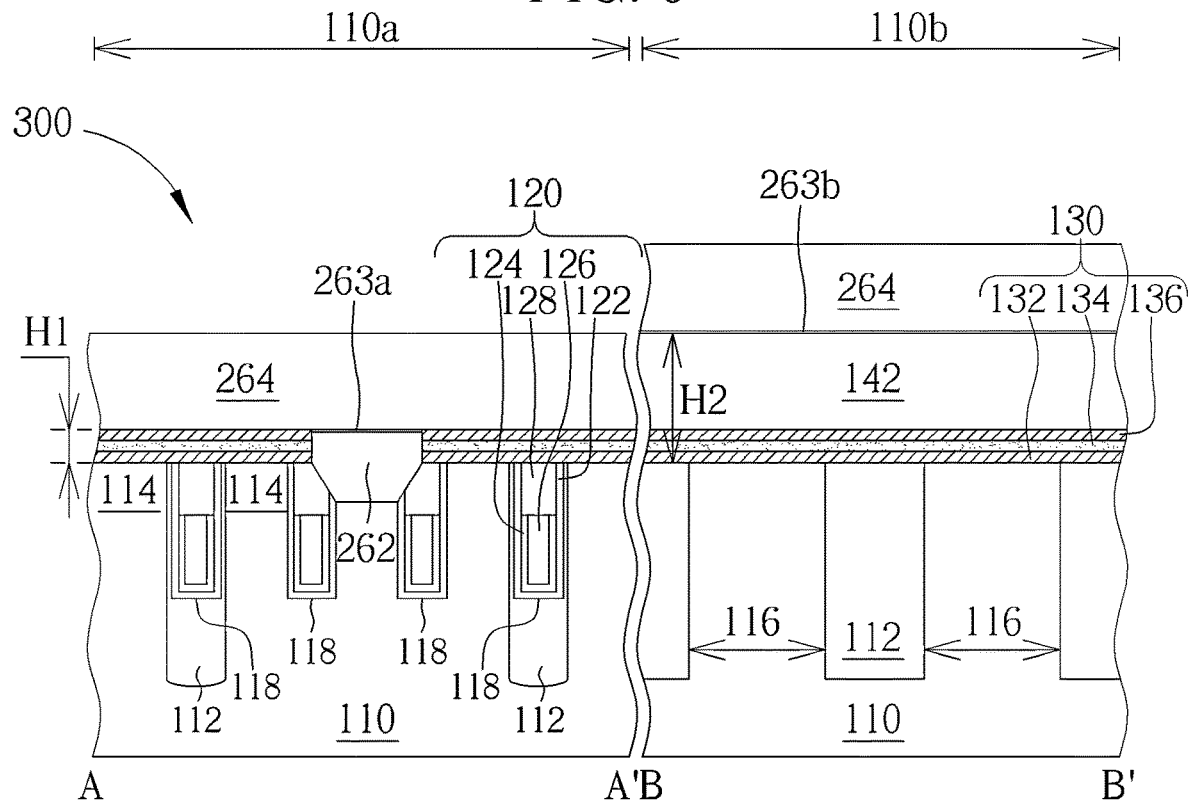
Figure 8:
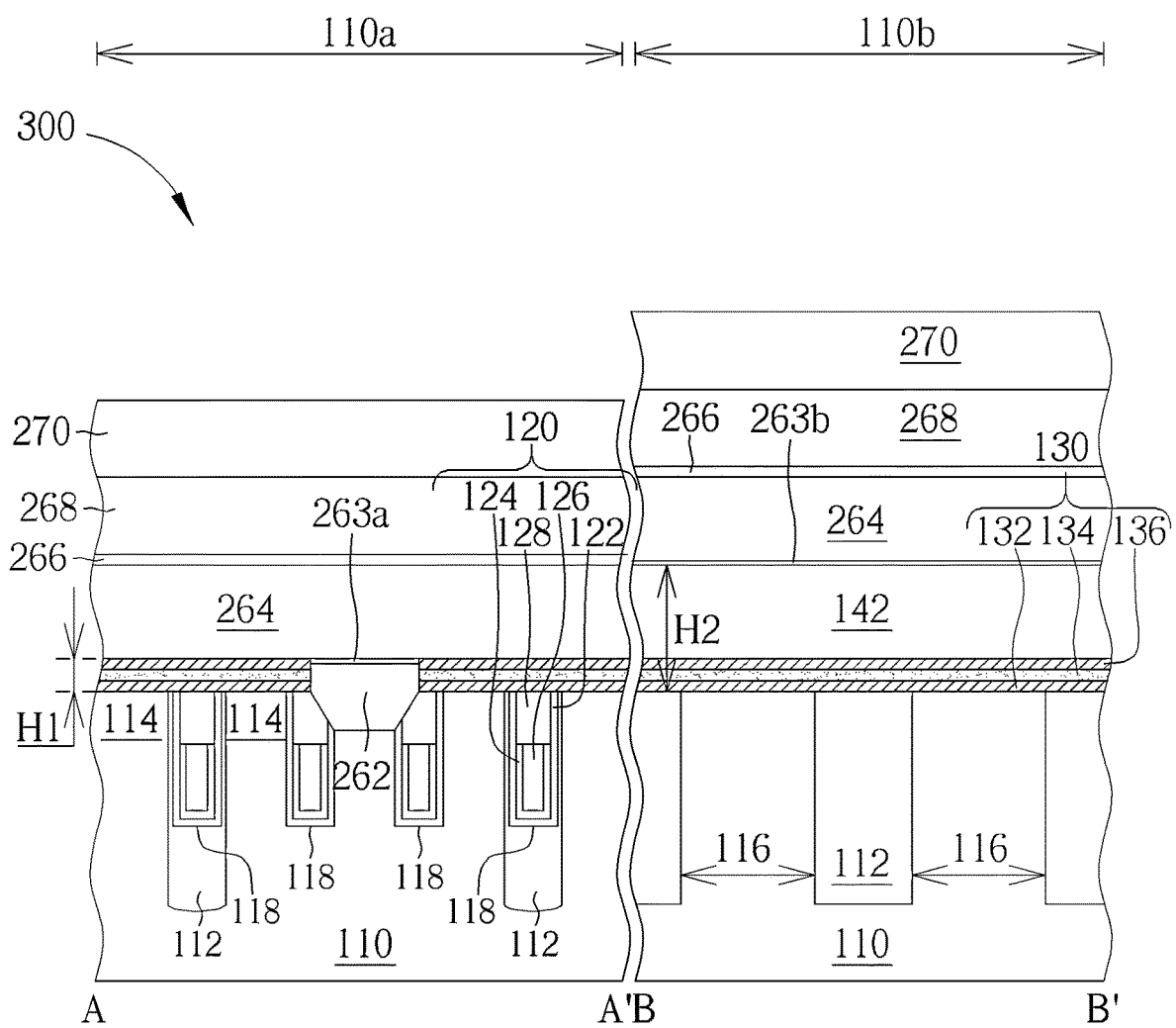
Figure 9:
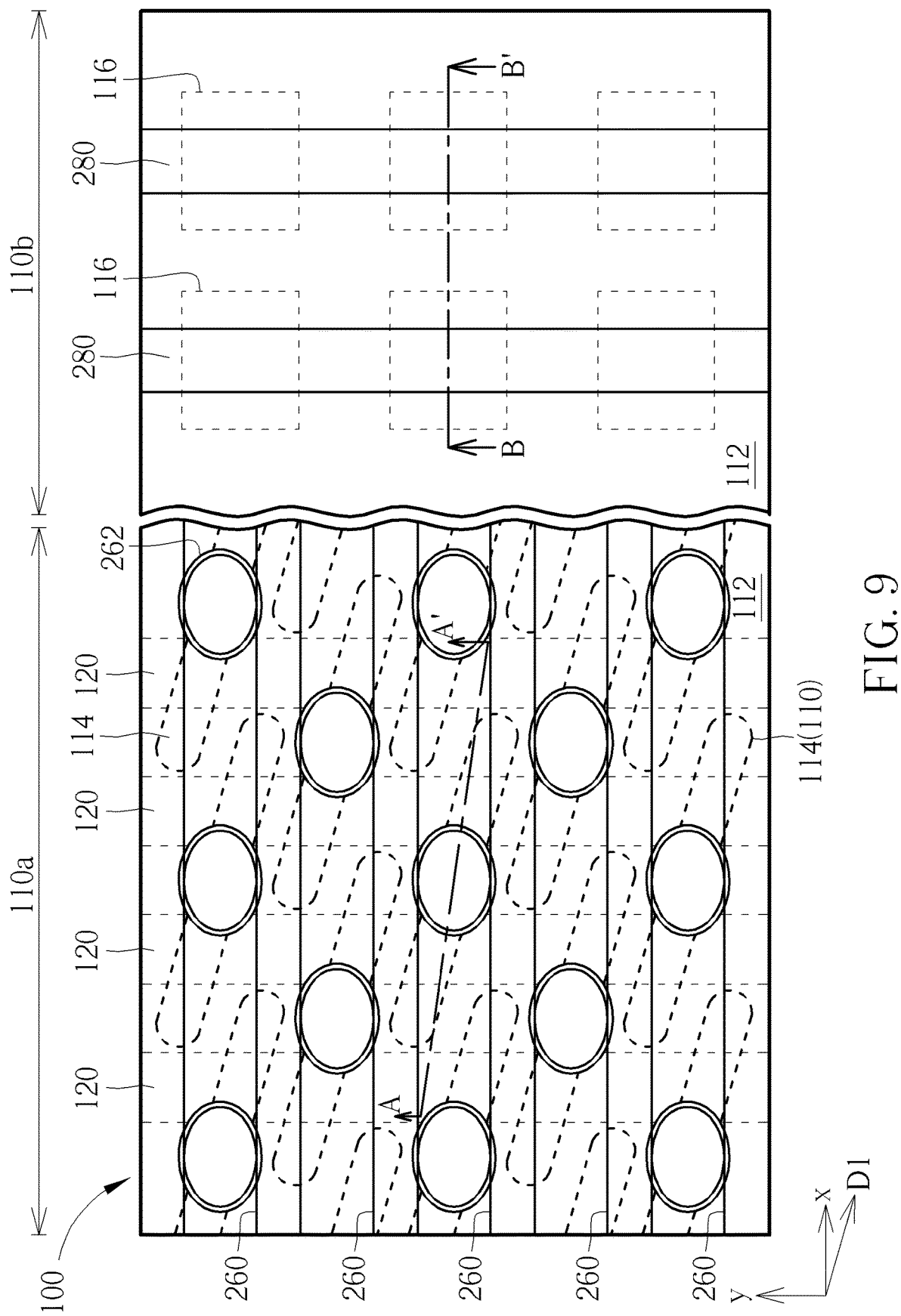
Figure 10:
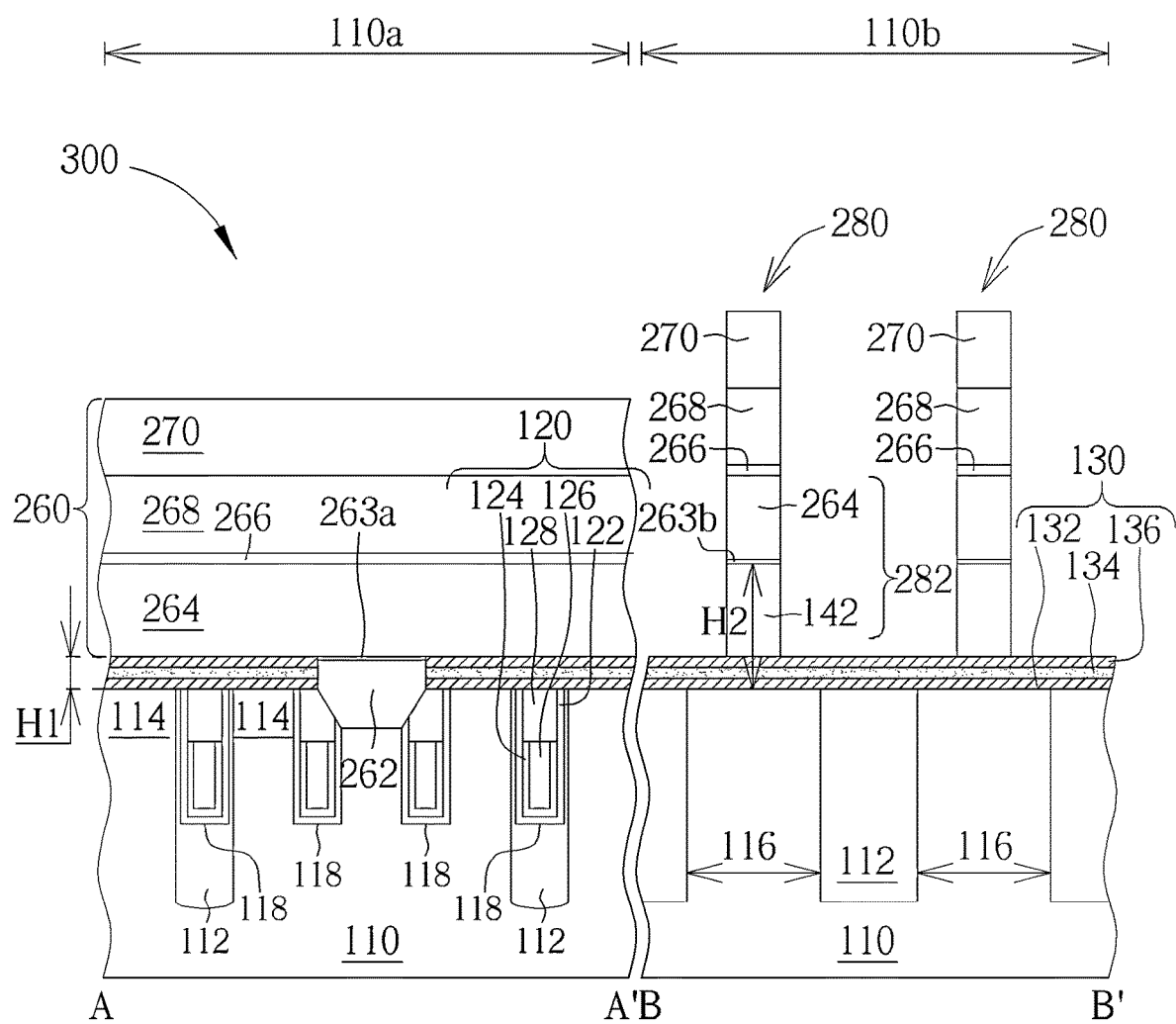

Please refer to FIG. 6 to FIG. 10, which illustrate schematic diagrams of a semiconductor device 300 according to the second embodiment in the present disclosure, with FIG. 6 to FIG. 8 respectively illustrating a cross-sectional view of the semiconductor device 300 during the fabricating processes, with FIG. 9 illustrating a top view of the semiconductor device 300 during the fabricating process, and with FIG. 10 illustrating a cross-sectional view taken along a cross line A-A' and a cross lien B-B' in FIG. 9. The formal forming process of the present embodiment is substantially the same or similar to those in the first embodiment as shown in FIG. 1 to FIG. 4, and those steps will not be redundantly described herein. The difference between the present embodiment and the aforementioned first embodiment is in that each of gate structures 280 of the present embodiment includes a composite semiconductor layer.

As shown in FIG. 6, after forming the semiconductor device as shown in FIG. 4, a mask layer 250 is additionally formed on the substrate 110, covering the first semiconductor layer 142 disposed within the periphery region 110b to expose the first semiconductor layer 142 disposed within the memory cell region 100a, and an etching process is performed through the mask structure 250, to completely remove the first semiconductor layer 142 disposed within the memory cell region 110a, and to partially remove the contacts 162. Through these performances, while partially removing the contacts 162, the voids 162a originally formed within the contacts 162 may be also removed, to form the bit line contacts 262 as shown in FIG. 6, wherein each of the bit line contacts 262 includes a top surface 262a being coplanar with the top surface of the insulating layer 130 (namely, the top surface of the oxide layer 136). The bit line contacts 262 for example includes a semiconductor material like doped silicon, doped phosphorus, or silicon phosphide, and preferably includes doped silicon, but not limited thereto.

As shown in FIG. 7, a second semiconductor layer 264 is formed on the substrate 110, covering the memory cell region 100a and the periphery region 110b of the substrate 110, wherein the second semiconductor layer 264 for example includes a semiconductor material like doped silicon, doped phosphorus, or silicon phosphide, and preferably includes the material the same as that of the first semiconductor layer 142 and the contacts 262 (doped silicon), but not limited thereto. It is noted that, the second semiconductor layer 264 disposed within the memory cell region 110a directly contacts the insulating layer 130 and the bit line contacts 262, and the second semiconductor layer 264 disposed within the periphery region 110b directly contacts the first semiconductor layer 142. Although the second semiconductor layer 264 and the bit line contacts 262 disposed therebelow, the second semiconductor 264 and the first semiconductor layer 142 disposed therebelow, both include the same semiconductor material (such as the doped silicon), a first oxidized interface layer 263a and a second oxidized interface layer 263b may be respectively formed thereby between the second semiconductor layer 264 and the bit line contacts 262 disposed therebelow, and between the second semiconductor 264 and the first semiconductor layer 142 disposed therebelow due to the oxidation easily occurred on surfaces of the semiconductor materials during the process, as shown in FIG. 7. In addition, it is also noted that, a thickness of the first oxidized interface layer 263a and the second oxidized interface layer 263b is quite thin, for example being about 0.01 angstroms to 1 angstroms, and which may not affect the electrical connection between the second semiconductor layer 264 and the bit line contacts 262 disposed therebelow, and between the second semiconductor 264 and the first semiconductor layer 142 disposed therebelow. The first oxidized interface layer 263a and the second oxidized interface layer 263b are obviously in different heights H1, H2 in a direction being perpendicular to the substrate 110, and the height H2 of the second oxidized interface layer 263b is greater than the height H1 of the first oxidized interface layer 263a. Accordingly, a topmost surface of the second oxidized interface layer 263b is higher than a topmost surface of the first oxidized interface layer 263a.

As shown in FIG. 8, a barrier layer 266, a conductive layer 268 and a covering layer 270 are sequentially formed on the second semiconductor layer 264, to entirely cover the memory cell region 110a and the periphery region 110b of the substrate 110. The barrier layer 266 for example including tantalum and/or tantalum nitride, or titanium and/or titanium nitride, and the conductive layer 268 for example includes a low-resistant metal like aluminum, titanium, copper, or tungsten, and the covering layer 270 for example includes a dielectric material like silicon oxide, silicon nitride, or silicon oxynitride, but is not limited thereto.

After that, as shown in FIG. 9 to FIG. 10, a photolithography process and an etching process are performed, to pattern the second semiconductor layer 264, the barrier layer 266, the conductive layer 268, and the covering layer 270 stacked one over another within the memory cell region 110a, to form a plurality of bit lines 260 which is parallel arranged along the x-direction thereby, and to simultaneously pattern the first semiconductor layer 142, the second semiconductor layer 264, the barrier layer 266, the conductive layer 268, and the covering layer 270 stacked one over another within the periphery region 110b, to form a plurality of gate structures 280 which is parallel arranged along the y-direction thereby. Each of the bit lines 260 extended along the x-direction intersects each of the active areas 114 disposed within the memory cell region 110a and the buried word lines (namely, the buried gate structures 120) disposed in the substrate 110, so that, each of the bit lines 260 disposed on the substrate 110 may be electrically connected to source/drain regions (not shown in the drawings) of a transistor (not shown in the drawings) through the contacts 262 disposed under the bit lines 260 and extended into the substrate 110, and be isolated from the buried word lines disposed within the substrate 110 through the isolating layer 130 disposed on the substrate 110. Accordingly, each of the bit lines 260 includes a semiconductor layer (only including the second semiconductor layer 264), the barrier layer 266, the conductive layer 268, and the covering layer 270 stacked from bottom to top, with the first oxidized interface layer 263a being formed between the semiconductor layer and the bit line contacts 262 disposed therebelow, and each of the gate structures 280 includes a semiconductor layer 282, the barrier layer 266, the conductive layer 268, and the covering layer 270 stacked form bottom to top, wherein the semiconductor layer 282 of each gate structure 280 further includes the first semiconductor layer 142 and the second semiconductor layer 264 stacked sequentially, and the second oxidized interface layer 263b is formed between the first semiconductor layer 142 and the second semiconductor layer 264, as shown in FIG. 9 to FIG. 10. Furthermore, the barrier layer 266 of each of the bit lines 260 and the barrier layer 266 of each of the gate structure 280 include the same material, the covering layer 270 of each of the bit lines 260 and the covering layer 270 of each of the gate structure 280 also include the same material, and a top surface of the covering layer 270 of each of the bit lines 260 and a top surface of the covering layer 270 of each of the gate structure 280 are not in the same height. It is noteworthy that the insulating layer 130 is disposed below each of the gate structures 280. In one embodiment, the insulating layer 130 may be functioned like a gate dielectric layer, and the insulating layer 130 and the gate structures 280 disposed over the insulating layer 130 may together form a transistor. However, in another embodiment, the nitride layer 134 of the insulating layer 130 may be functioned like a charge trapping layer, and the insulating layer 130 and the gate structures 280 disposed over the insulating layer 130 may together form a silicon-oxide-nitride-oxide-silicon flash memory device (SONOS flash memory device), but is not limited thereto.

Through the above-mentioned processes, the semiconductor device 300 according to the second embodiment of the present disclosure is formed. Accordingly to the fabricating method of the present embodiment, the first semiconductor layer 142 disposed within the memory cell region 110a, as well as the voids 162a formed therein are firstly removed through an etching process, followed by forming the second semiconductor layer 264. In other words, the fabricating method of the present embodiment utilizes a two-stepped deposition process to respectively form the bit line contacts 262 and the semiconductor layer (only including the second semiconductor layer 264) of the bit lines 260 which have the same material, and to form the composite semiconductor layer 282 (including the first semiconductor layer 142 and the second semiconductor layer 264 stacked sequentially and having the same material) of the gate structures 280. Accordingly, the first oxidized interface layer 263a may be formed between the semiconductor layer and the bit line contacts 262 of the bit lines 260, the second oxidized interface layer 263b may be formed in the composite semiconductor layer 282, and which may not affect the electrically connection between each of the bit lines 260, each of the bit line contacts 262, and each of the gate structures 280. In this way, the fabricating method of the present embodiment is sufficient to reduce the poor functions of the bit line contacts 262 caused by the voids, thereby improving the structural reliability, as well as the element performance of the semiconductor device 300.

Figure 11:
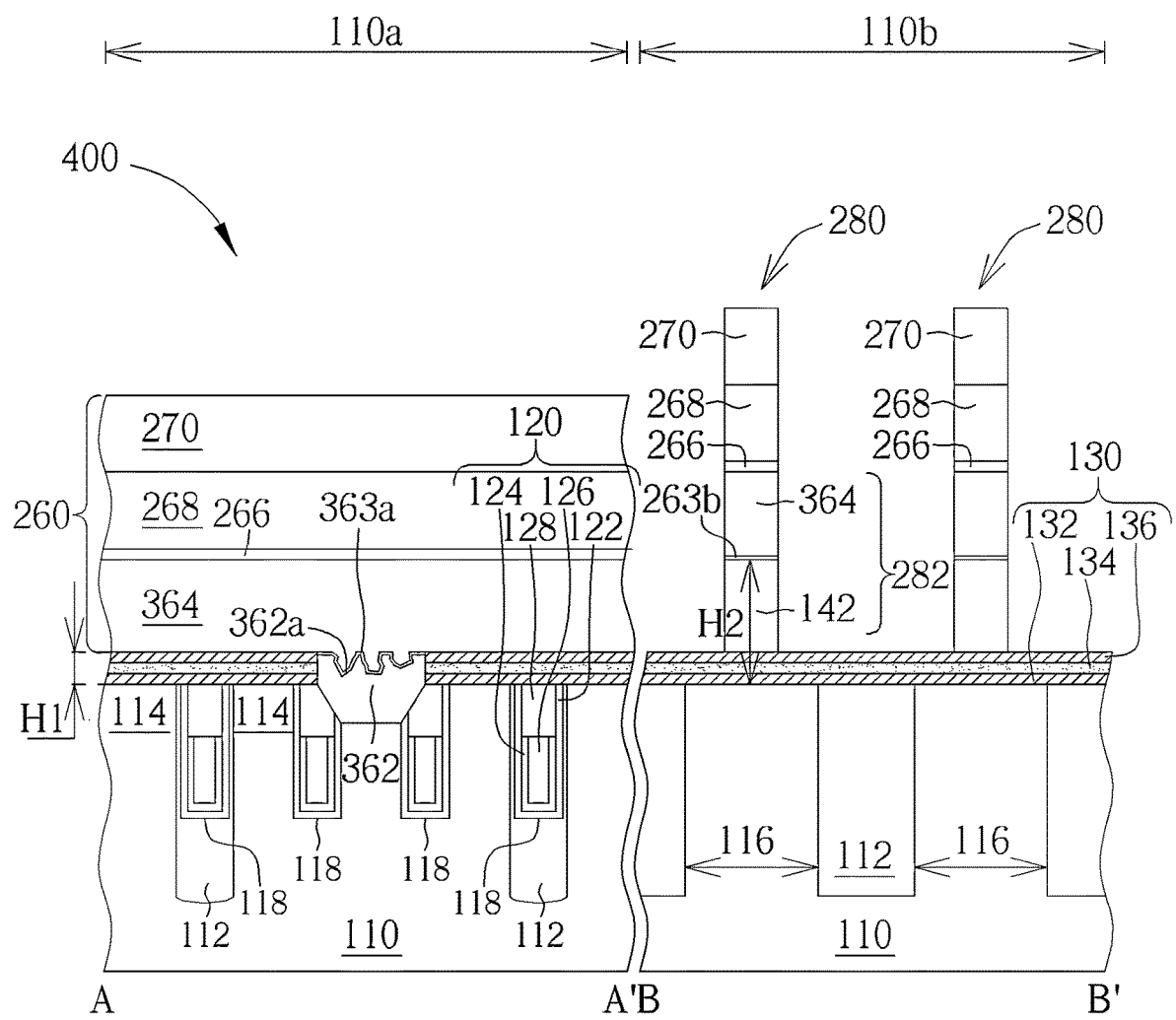
FIG. 11 is a schematic diagram illustrating a semiconductor device according to a third embodiment in the present disclosure.

Please refer to FIG. 11, which illustrate schematic diagrams of a semiconductor device 400 according to the third embodiment in the present disclosure. The formal forming process of the present embodiment is substantially the same or similar to those in the second embodiment, and those steps will not be redundantly described herein. The difference between the present embodiment and the aforementioned second embodiment is in that a second semiconductor layer 364 of the present embodiment further fills in voids 362a which are exposed from surfaces of the bit line contacts 362.

Precisely speaking, while performing the etching process (for example as shown in FIG. 6 of the aforementioned second embodiment), only the voids 162 which are closed to top surfaces of the contacts 162 are removed, thereby exposing voids 362a which are in relative lower positions in the contacts 162. Accordingly, while forming a second semiconductor layer 364 (for example as shown in FIG. 7 of the aforementioned second embodiment) in the subsequent process, the second semiconductor layer 364 formed within the memory cell region 110a may further fill in the exposed voids 362a, to fill up the voids 362a. Also, in the present embodiment, a first oxidized interface layer 363a is formed between the second semiconductor layer 364 and the bit line contacts 362 disposed therebelow, and a portion of the first oxidized interface layer 363a is formed on the exposed surfaces of the voids 362a to therefore present in a non-linear shape, as shown in FIG. 11.

Through the above-mentioned processes, the fabricating method of the present embodiment also utilizes a two-stepped deposition process to respectively form the bit line contacts 362 and the semiconductor layer (only including the second semiconductor layer 364) of the bit lines 260 which have the same material, and to form the composite semiconductor layer 282 (including the first semiconductor layer 142 and the second semiconductor layer 364 stacked sequentially and having the same material) of the gate structures 280. In addition, in the present embodiment, the second semiconductor layer 364 disposed within the memory cell region 110a further fills in the voids 362a, so that, the first oxidized interface layer 363a disposed between the semiconductor layer and the bit line contacts 362 may therefor present in a non-linear shape. In this way, the oxidized interface layers may not lead to any negative effect to the electrical connection of each of the bit lines 260, each of the bit line contacts 362, or each of the gate structures 280, and which may significantly improve the poor functions of the bit lien contacts 262 caused by the voids. Thus, the structural reliability, as well as the element performance of the semiconductor device 400 may be also improved in the present embodiment.

Figure 12:
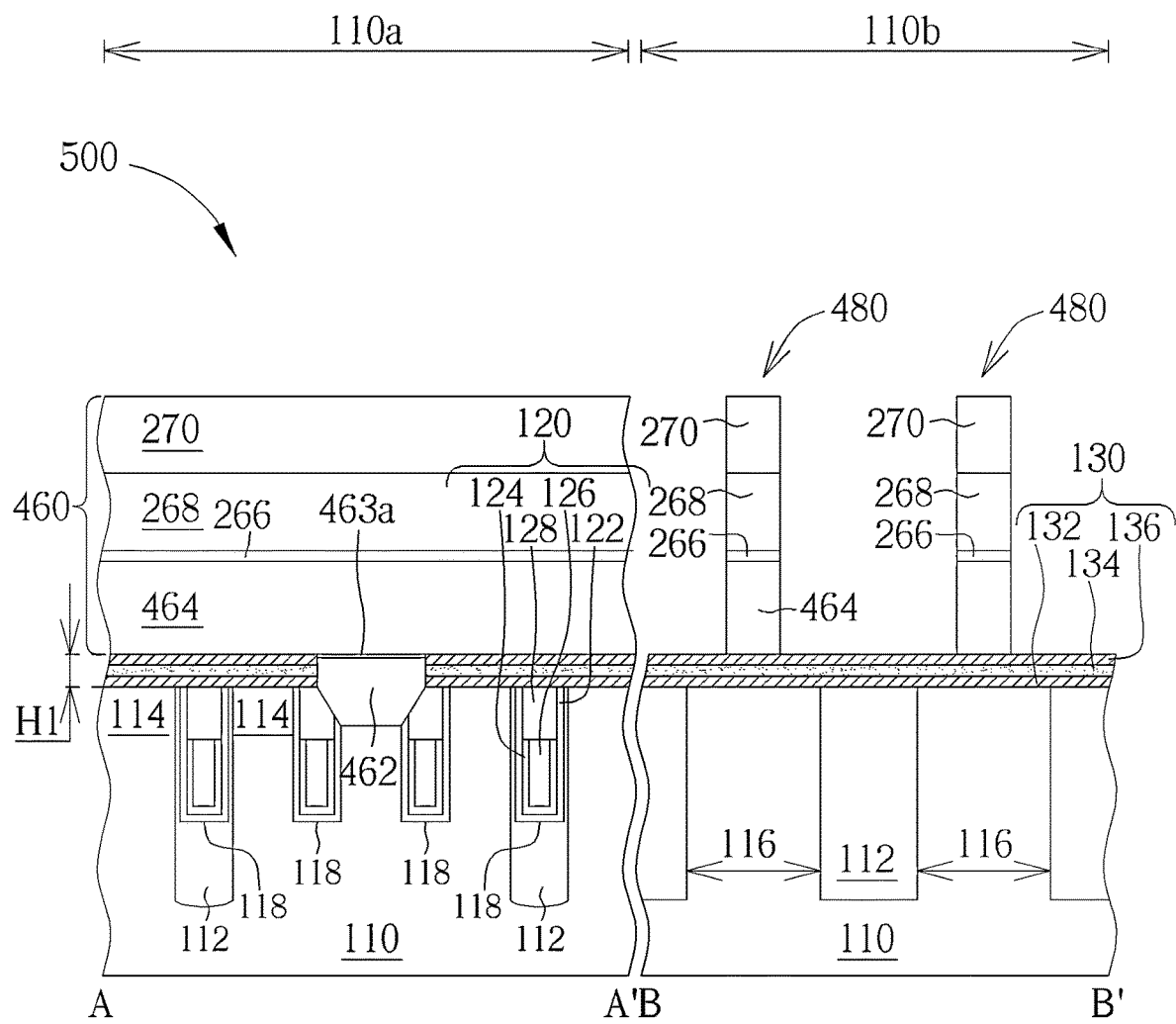
FIG. 12 is a schematic diagram illustrating a semiconductor device according to a fourth embodiment in the present disclosure.

Please refer to FIG. 12, which illustrate schematic diagrams of a semiconductor device 500 according to the fourth embodiment in the present disclosure. The formal forming process of the present embodiment is substantially the same or similar to those in the second embodiment, and those steps will not be redundantly described herein. The difference between the present embodiment and the aforementioned second embodiment is in that each of gate structures 480, or each of bit lines 460 in the present embodiment respectively include a semiconductor layer (only including a second semiconductor layer 464), the barrier layer 266, the conductive layer 268, and the covering layer 270 stacked from bottom to top, wherein an oxidized interface layer 463a is formed only between the semiconductor layer of each bit line 460 and the bit line contacts 462 disposed therebelow.

Precisely speaking, while performing the etching process (as shown in FIG. 6 of the aforementioned second embodiment) of the present embodiment, the first semiconductor layer 142 disposed within the memory cell region 110a and within the periphery region 110b are simultaneously removed, and also, the voids 162a formed within the contacts 162 are removed. Accordingly, while forming a second semiconductor layer 464 (as shown in FIG. 7 of the aforementioned second embodiment), the second semiconductor layer 464 may directly cover on the insulating layer 130. Then, the second semiconductor layer 464 formed within the memory cell region 110a may directly contacts the bit line contacts 462 disposed therebelow, wherein the oxidized interface layer 463a may be formed between the second semiconductor layer 464 within the memory cell region 110a and the bit line contacts 462, as shown in FIG. 12. It is noted that, the oxidized interface layer 463a is quite thin, for example being about 0.01-1 angstrom, and which may not lead to any negative effects to the electrical connection between the second semiconductor layer 464 and the bit line contacts 462 disposed therebelow.

Through the above-mentioned processes, the semiconductor device 500 according to the fourth embodiment of the present disclosure is formed. Accordingly to the fabricating method of the present embodiment, the first semiconductor layer 142, as well as the voids 162a formed within the contacts 162, is completely removed through an etching process, followed by forming the second semiconductor layer 464. In other words, the mask layer 250 formed in the aforementioned embodiments may be omitted in the fabricating method of the present embodiment, and the fabricating method of the present embodiment also utilizes a two-stepped deposition process to respectively form the bit line contacts 462 and the semiconductor layer (namely, the second semiconductor layer 464) of the bit lines 460 which have the same material, and to form the semiconductor layer (namely, the second semiconductor layer 464) of the gate structures 480. Accordingly, the oxidized interface layer 463a may only be formed between the semiconductor layer of the bit lines 460 and the bit line contacts 462, and also, the covering layer 270 of each of the gate structures 480 and the covering layer 270 of each of the bit lines 460 in the present embodiment may be in the same height. With these arrangements, the oxidized interface layer 463a may not lead to any negative effects to the electrical connection of each of the bit lines 460 or each of the bit line contacts 462, and which may significantly improve the poor functions of the bit lien contacts 462 caused by the voids. Thus, the structural reliability, as well as the element performance of the semiconductor device 500 may be also improved in the present embodiment, and the fabricating process of the semiconductor device 500 may also be simplified.

People in the art shall easily realize that the semiconductor device and the fabricating method thereof in the present disclosure may include other examples, in order to meet practical product requirements. For example, in other embodiments, accordingly the forming positions of the voids 162a in the contacts 162, the etching process may only partially remove the first semiconductor layer 142 formed within the memory cell region 110a and within the periphery region 110b, followed by forming the second semiconductor layer. Then, the first oxidized interface layer is formed between the semiconductor layer (namely the first semiconductor layer 142) of the bit lines and the bit line contacts, the second oxidized interface layer is formed between the composite semiconductor layer (including the first semiconductor layer and the second semiconductor layer) of the gate structures, and first oxidized interface layer and the second oxidized interface layer of the present embodiment are in the same height. In this way, the structural reliability and the performance of the semiconductor device may both improve under a simplified process flow.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a substrate;
a plurality of bit lines disposed on the substrate;
a plurality of bit line contacts disposed in the substrate and under a portion of the plurality of bit lines;
a gate structure disposed on the substrate, wherein the plurality of bit lines and the gate structure each comprise a semiconductor layer, a conductive layer and a covering layer stacked in sequence;
a first oxidized interface layer disposed between a bottom surface of the semiconductor layer of one of the plurality of bit lines and a top surface of a corresponding one of the plurality of bit line contacts under the one of the plurality of bit lines; and
a second oxidized interface layer disposed in the semiconductor layer of the gate structure.

2. The semiconductor device according to claim 1, wherein the second oxidized interface layer is disposed at a level higher than a level of the first oxidized interface layer in a vertical direction.

3. The semiconductor device according to claim 1, wherein the semiconductor layer of the gate structure comprises a first semiconductor layer and a second semiconductor layer stacked in sequence, and the second oxidized interface layer is disposed between the first semiconductor layer and the second semiconductor layer.

4. The semiconductor device according to claim 3, wherein the first semiconductor layer and the second semiconductor layer comprise a same material.

5. The semiconductor device according to claim 3, wherein the substrate comprises a memory cell region and a periphery region,
the gate structure and the second oxidized interface layer are formed within the periphery region, and
the plurality of bit lines, the plurality of bit line contacts, and the first oxidized interface layer are formed within the memory cell region.

6. The semiconductor device according to claim 1, wherein each of the plurality of bit line contacts comprises a plurality of voids, and the semiconductor layer of each of the plurality of bit lines is filled up the plurality of voids.

7. The semiconductor device according to claim 6, wherein the first oxidized interface layer comprises a non-planar top surface.

8. The semiconductor device according to claim 1, wherein the covering layer of the gate structure and the covering layer of each of the plurality of bit lines comprise a same material, and a top surface of the covering layer of the gate structure and a top surface of the covering layer of each of the plurality of bit lines are not in a same level.

9. A semiconductor device, comprising:
a substrate;
a plurality of bit lines disposed on the substrate;
a plurality of bit line contacts disposed in the substrate and under a portion of the plurality of bit lines;
a gate structure disposed on the substrate, wherein the plurality of bit lines and the gate structure each comprise a semiconductor layer, a conductive layer and a covering layer stacked from bottom to top; and
an oxidized interface layer disposed between a bottom surface of the semiconductor layer of one of the plurality of bit lines and a top surface of a corresponding one of the plurality of bit line contacts under the one of the plurality of bit lines.

10. The semiconductor device according to claim 9, wherein the plurality of bit line contacts, the semiconductor layer of the gate structure and the semiconductor layer of each of the plurality of bit lines comprise a same material.

11. The semiconductor device according to claim 9, wherein the substrate comprises a memory cell region and a periphery region,
the gate structure is disposed within the periphery region, and
the plurality of bit lines, the plurality of bit line contacts, and the oxidized interface layer are disposed within the memory cell region.

12. The semiconductor device according to claim 9, wherein the covering layer of the gate structure and the covering layer of each of the plurality of bit lines comprise a same material, and
a top surface of the covering layer of the gate structure and a top surface of the covering layer of each of the plurality of bit lines are in a same height.

13. A semiconductor device, comprising:
a substrate;
a plurality of bit lines disposed on the substrate;
a plurality of bit line contacts disposed in the substrate and under a portion of the plurality of bit lines;
a gate structure disposed on the substrate, wherein the plurality of bit lines and the gate structure each comprise a semiconductor layer, a conductive layer and a covering layer stacked from bottom to top;
a first oxidized interface layer disposed between a bottom surface of the semiconductor layer of one of the plurality of bit lines and a top surface of a corresponding one of the plurality of bit line contacts under the one of the plurality of bit lines, wherein the first oxidized interface layer comprises a non-planar top surface; and
a second oxidized interface layer disposed in the semiconductor layer of the gate structure.

14. A method of fabricating a semiconductor device, comprising:
providing a substrate;
forming a plurality of bit line contacts in the substrate;
forming a plurality of bit lines on the substrate and the plurality of bit line contacts;
forming a gate structure on the substrate, wherein the plurality of bit lines and the gate structure each comprise a semiconductor layer, a conductive layer and a covering layer stacked from bottom to top;
forming a first oxidized interface layer between a top surface of the semiconductor layer of one of the plurality of bit line contacts and a bottom surface of the semiconductor layer of a corresponding one of the plurality of bit lines above the one of the plurality of bit line contacts; and
forming a second oxidized interface layer in the semiconductor layer of the gate structure, wherein a topmost surface of the second oxidized interface layer is higher than a topmost surface of the first oxidized interface layer.

15. The method of fabricating the semiconductor device according to claim 14, further comprising:
   forming a plurality of buried gate structures in the substrate;
   forming a first semiconductor layer on the substrate;
   forming a plurality of contact openings extending from the first semiconductor layer to portions of the substrate between any two adjacent ones of the plurality of buried gate structures;
   forming a plurality of contacts by filling the plurality of contact openings with a conductive material; and
   performing an etching process to form the plurality of bit line contacts by removing a portion of the first semiconductor layer and a portion of each of the plurality of contacts.

16. The method of fabricating the semiconductor device according to claim 15, further comprising:
   after performing the etching process, forming a second semiconductor layer on the substrate and a remaining portion of the first semiconductor layer;
   wherein the semiconductor layer of the gate structure comprises the first semiconductor layer and the second semiconductor layer stacked from bottom to top.

17. The method of fabricating the semiconductor device according to claim 16, wherein the first oxidized interface layer and the second oxidized interface layer are formed before forming the second semiconductor layer.

18. The method of fabricating the semiconductor device according to claim 16, wherein a top surface of each of the bit line contacts comprises a plurality of voids.

19. The method of fabricating the semiconductor device according to claim 18, wherein the second semiconductor layer is filled up the plurality of voids.

20. The method of fabricating the semiconductor device according to claim 14, wherein the substrate comprises a memory cell region and a periphery region,
   the gate structure and the second oxidized interface layer are formed within the periphery region, and
   the plurality of bit lines, the plurality of bit line contacts, and the first oxidized interface layer are formed within the memory cell region.

* * * * *